United States Patent
Peterson

(10) Patent No.: US 10,158,203 B2
(45) Date of Patent: Dec. 18, 2018

(54) POWER BUS CONNECTION SYSTEM WITH FUSIBLE CONDUCTIVE MATERIAL

(71) Applicant: Rockwell Automation Technologies, Inc., Mayfield, OH (US)

(72) Inventor: Corey A. Peterson, Grafton, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 0 days.

(21) Appl. No.: 15/476,192

(22) Filed: Mar. 31, 2017

(65) Prior Publication Data
US 2018/0287317 A1    Oct. 4, 2018

(51) Int. Cl.
| | |
|---|---|
| H02B 1/20 | (2006.01) |
| H01R 25/16 | (2006.01) |
| H01R 4/02 | (2006.01) |
| H01H 11/06 | (2006.01) |
| H02B 1/26 | (2006.01) |
| H01R 9/00 | (2006.01) |
| H02B 11/06 | (2006.01) |
| H02G 5/00 | (2006.01) |
| H02B 1/21 | (2006.01) |
| H01B 17/00 | (2006.01) |

(52) U.S. Cl.
CPC ........... *H01R 25/162* (2013.01); *H01H 11/06* (2013.01); *H01R 4/02* (2013.01); *H01B 17/00* (2013.01); *H02B 1/20* (2013.01); *H02B 1/21* (2013.01); *H02B 11/06* (2013.01); *H02G 5/00* (2013.01); *H02G 5/002* (2013.01); *H02G 5/005* (2013.01); *H05K 2201/10272* (2013.01)

(58) Field of Classification Search
CPC . H02B 1/20; H02B 11/06; H02B 1/21; H02B 1/22; H05K 2201/10272; H02G 5/00; H02G 5/005; H02G 5/002; H02G 5/007; H01B 5/02; H01B 17/00
USPC ................ 361/611, 624, 637–639, 648, 775; 174/16.2, 68.2, 72 B, 71 B, 88 B, 70 B, 174/99 B, 129 B, 133 B, 149 B
See application file for complete search history.

(56) References Cited

U.S. PATENT DOCUMENTS

| | | |
|---|---|---|
| 3,855,504 A | 12/1974 | Olashaw |
| 4,288,656 A | 9/1981 | Olashaw |
| (Continued) | | |

FOREIGN PATENT DOCUMENTS

| | | |
|---|---|---|
| EP | 2892310 A2 | 7/2015 |
| WO | 2007058764 A1 | 5/2007 |

OTHER PUBLICATIONS

Extended European Search Report dated Jun. 21, 2018; Application No. 18163500.4—(8) pages.

*Primary Examiner* — Binh Tran
(74) *Attorney, Agent, or Firm* — Boyle Fredrickson, S.C.

(57) ABSTRACT

A fusible conductive material can be used to electrically connect or join power distribution bus bars that are placed on opposing sides of an electrically insulating bus support. The fusible conductive material can be placed in an opening or hole in the bus support with the bus bars abutting the fusible conductive material on opposing sides. The fusible conductive material can then be ignited, such as by applying a voltage drop, to produce a localized heat source suitable to electrically join the bus bars together. By electrically connecting the bus bars in this manner, the bus bars can better conduct, be less susceptible to separation and require less maintenance with respect to connectivity.

19 Claims, 8 Drawing Sheets

(56) References Cited

U.S. PATENT DOCUMENTS

| | | |
|---|---|---|
| 7,635,076 B2 | 12/2009 | Duckham et al. |
| 8,523,045 B2 | 9/2013 | Perry et al. |
| 2004/0169578 A1* | 9/2004 | Jollenbeck ............ H01H 85/046<br>337/227 |
| 2010/0314166 A1* | 12/2010 | Malkowski, Jr. ......... H02B 1/21<br>174/72 B |
| 2012/0305283 A1* | 12/2012 | Kalayjian ............ H05K 7/1432<br>174/68.2 |

\* cited by examiner

POWER BUS CONNECTION SYSTEM WITH FUSIBLE CONDUCTIVE MATERIAL

FIELD OF THE INVENTION

The present invention relates generally to electrical systems, and more particularly, to power bus connection systems, such as Motor Control Centers (MCC's), in which power conductors are electrically connected through apertures or openings in electrically insulating bus supports by fusible conductive materials.

BACKGROUND OF THE INVENTION

Electrical systems with packaged electrical and electronic components are known and are in use. For example, Motor Control Centers (MCC's) are used for power and data distribution in large and industrial operations. In MCC's, a variety of components, such as switchgear, semiconductor power electronic circuits, programmable logic controllers, motor controllers, and so forth, are housed in large electrical enclosures that may be subdivided into sections or columns, which may be further subdivided into compartments. The MCC includes associated bus bars, interconnections and supporting structures for distribution of electrical power to the various compartments.

Typically, the MCC is connected to a main power line that may feed three-phase AC power to horizontal bus bars of the MCC. The horizontal bus bars, in turn, may feed the three-phase power to vertical bus bars disposed in each of the sections or columns of the MCC. The vertical bus bars, in turn, may feed the three-phase power to various units (which typically include electrical components) that are installed in compartments of a section. The units, in turn, may provide power terminals (conductors), such as copper bus bars, for feeding the three-phase power to a system environment, such as motors, as may be required for various applications.

The horizontal bus bars are typically connected to the vertical bus bars via bolts, screws and/or similar fasteners. However, such connections can loosen over time, which could potentially adversely affect connectivity and temperature control in the system. Consequently, an operator must periodically check the aforementioned connections for application of the correct torque and avoidance of overheating. This can be a time consuming effort which can be farther complicated by the difficulty in accessing connections buried beneath numerous hardware elements. This can also be complicated by the limited time in which it may be acceptable to take such a system offline in order to conduct such verifications. A need therefore exists which eliminates one or more of the foregoing disadvantages.

SUMMARY OF THE INVENTION

A fusible conductive material can be used to electrically connect or join power distribution bus bars that are placed on opposing sides of an electrically insulating bus support. The fusible conductive material can be placed in an opening or hole in the bus support with the bus bars abutting the fusible conductive material on opposing sides. The fusible conductive material can then be ignited, such as by applying a voltage drop, to produce a localized heat source suitable to electrically join the bus bars together. By electrically connecting the bus bars in this manner, the bus bars can better conduct, be less susceptible to separation and require less maintenance with respect to connectivity.

An aspect of the invention can provide for maintenance free electrical connections which eliminate mechanical bolted connections which may require operators to validate that such connections have not loosened and are not overheated. Accordingly, a system can be provided for making electrical connections between bus bars without requiring bolts, screws and/or other fasteners. The system can eliminate the need to conduct periodic checks of such connections due to loosening and/or overheating. In one aspect, a material that is made of "nanoparticles" of nickel and/or aluminum can be used to solder copper bus bars together to create a maintenance free electrical joint. With the use of such nanoparticles, which can be packaged in "nanofoils," the temperature at a bond interface can substantially elevate in temperature, on the order of about 1500° C., nearly instantaneously, in a localized area, which can sufficiently "wet" the material of the bus bars to produce an intermetallic bond having good strength and electrical connection performance. A wide variety of sizes of bus bars can be connected together, thereby eliminating the need for bolted connection. Moreover, due to such elimination of bolted connection, extra space may be provided for further system improvements, such as the integration of more compact design features that would not otherwise be possible.

Specifically then, one aspect of the present invention can provide a power bus connection system including: an electrically insulating bus support having an aperture, opening or hole; a first power conductor disposed on a first side of the bus support; and a second power conductor disposed on a second side of the bus support. The first and second power conductors are electrically connected through the aperture by a fusible conductive material.

Another aspect of the present invention can provide a power bus connection method including: placing a first power conductor on a first side of an electrically insulating bus support having an aperture; placing a second power conductor on a second side of the bus support; and electrically connecting the first and second power conductors through the aperture using a fusible conductive material.

Another aspect of the present invention can provide a Motor Control Center (MCC) including: a section forming a shell around a device mounting volume for supporting a plurality of electrical units, the section including: first, second and third vertical bus conductors for providing power to the electrical units; first, second and third horizontal bus conductors for providing power to the first, second and third vertical bus conductors, respectively; and an electrically insulating bus support having first, second and third apertures. The first, second and third vertical bus conductors can be disposed on a first side of the bus support, and the first, second and third horizontal bus conductors can be disposed on a second side of the bus support. The first, second and third vertical bus conductors can be electrically connected to the first, second and third horizontal bus conductors through the first, second and third apertures via first, second and third fusible conductive materials, respectively.

Accordingly, in one aspect of the invention, first, second and third vertical bus conductors can be electrically connected to first, second and third horizontal bus conductors in a "3 pole" configuration. This can be useful, for example, for providing three-phase electrical power from a power supply grid. However, it will be appreciated that other variations of the invention can include a greater number of poles, such as a "4 pole" configuration which could be useful, for example, for including a "neutral," or a lesser number of poles, such as a "single pole" configuration, which could be useful, for example, for providing a single electrical power bus. Such variations are deemed within the scope of the invention.

In addition, various geometries for the bus conductors can be realized within the scope of the invention. For example, in one aspect, horizontal bus conductors that are substantially rectangular can be electrically connected to vertical bus conductors that are substantially cylindrical via fusible conductive materials. However it will be appreciated that numerous other shapes for conductors can be provided within the scope of the invention.

Also, while opposing conductors, such as horizontal and vertical bus conductors, can be electrically connected through a bus support for a given section, it should be appreciated that neighboring sections can also electrically connect conductors without having to connect through a bus support. For example, horizontal bus conductors of a first section can electrically connect to horizontal bus conductors of a second section that is a neighboring or flanking section, via fusible conductive materials, without electrically connecting through a bus support. Such variations are deemed within the scope of the invention.

These and other objects, advantages and aspects of the invention will become apparent from the following description. The particular objects and advantages described herein can apply to only some embodiments falling within the claims and thus do not define the scope of the invention. In the description, reference is made to the accompanying drawings which form a part hereof, and in which there is shown a preferred embodiment of the invention. Such embodiment does not necessarily represent the full scope of the invention and reference is made, therefore, to the claims herein for interpreting the scope of the invention.

BRIEF DESCRIPTION OF THE DRAWINGS

Preferred exemplary embodiments of the invention are illustrated in the accompanying drawings in which like reference numerals represent like parts throughout, and in which.

DETAILED DESCRIPTION OF THE OF THE INVENTION

Figure 1:
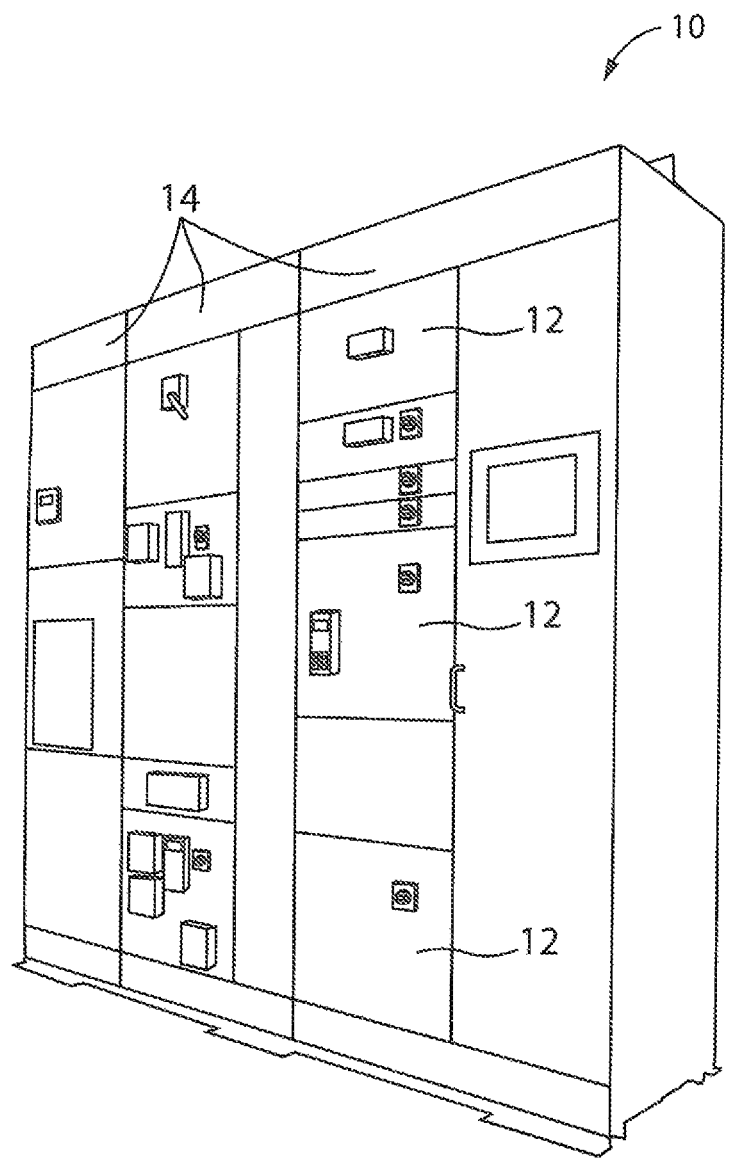
FIG. 1 is an isometric view of an exemplar electrical system in which electrical units of various types may be housed in accordance with an aspect of the invention.
Figure 2:
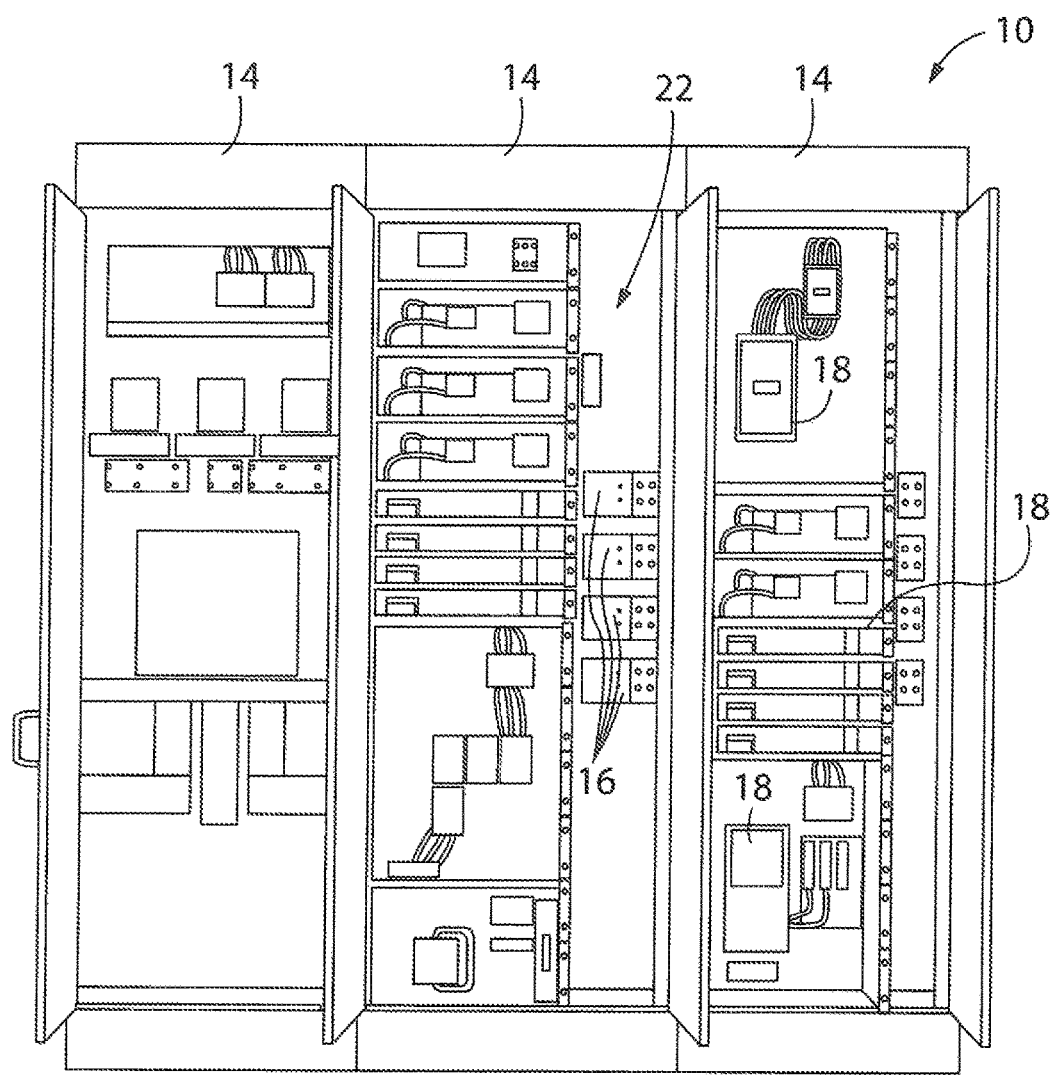
FIG. 2 is an interior view of the electrical system of FIG. 1.

Referring now to FIGS. 1 and 2, an exemplar electrical system 10 is provided in which electrical units 12 of various types may be housed. The electrical system 10 may be, for example, a Motor Control Center ("MCC") or other industrial, commercial, marine, or other electrical system. In general, the electrical system 10 may provide one or more sections 14, each forming a shell around a device mounting volume for supporting the units 12. The shell may be made of any suitable material, such as heavy gage sheet metal, reinforced plastics, and so forth. The electrical system 10 may typically receive three-phase power from an external power supply, such as a power supply grid, and/or data signals, via appropriate conduits (not shown), and distribute the received power and/or data signals to one or more of the sections 14 in various manners. The sections 14 may be electrically isolated from one another, or alternatively, may be electrically joined with other sections 14, such as via common horizontal power buses 16.

The units 12 may each include a door for covering an assembly of components 18 that are supported within each unit 12 via known methods, such as screwed ("fixed feed" or "frame mounted") or snap-in ("withdrawable") engagement, thereby providing mechanical and electrical connection to the electrical system 10. Exemplary components 18 of the units 12 may include relays, motor starters, and Programmable Logic Controllers ("PLC's"), among others. Doors for the units 12 may include, for example, a lever (such as a rotary lever to turn ON and OFF a Circuit Breaker inside the unit and enabling opening of the door when the Circuit Breaker is OFF), a lock for preventing the door from opening, and/or light for indicating a safe condition for opening the door. A latch rail (not shown) may be provided in each section 14 to interface with latches on the individual doors of the units 12.

The sections 14 may also include wire-ways 20 in which line and load wiring, cabling and so forth may be installed to service the components 18. The sections 14 may optionally include preconfigured isolation areas 22 for variations in which greater electrical isolation between sections 14 is desired, such as in compliance with IEC 61439-2 Forms 3, 3a, 4 or 4b.

Figure 3:
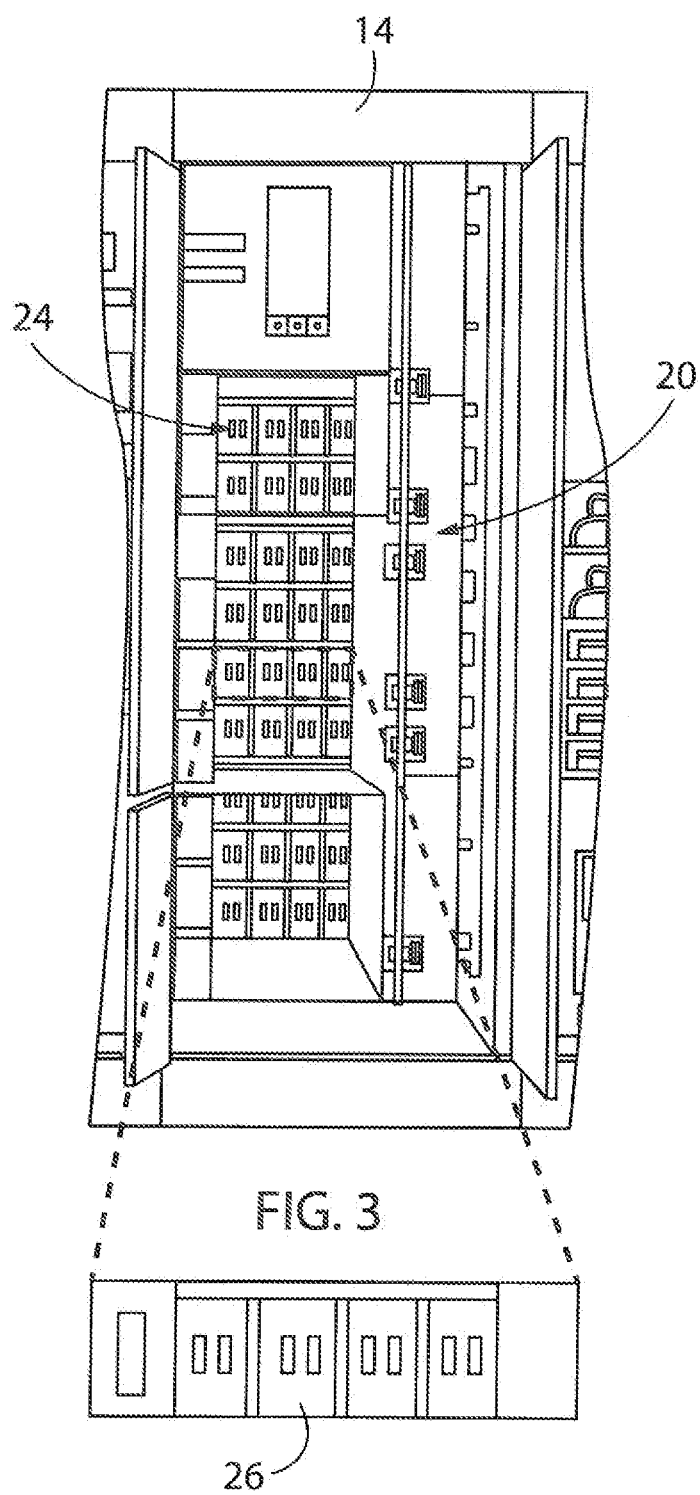
FIG. 3 is an interior view of a section of the electrical system of FIG. 1.

Referring also to FIG. 3, along a rear wall of each of the sections 14 may be disposed a vertical bus system 24 configured to facilitate distribution of power throughout a corresponding section 14, such as in a plug-in manner. The bus system 24 may be generally formed as a backplane having slots 26 for receiving conventional stab-type electrical connections on rear surfaces of device supports received within a section 14. Such slot and stab arrangements are generally known in the art. As illustrated, the slots 26 may be divided into pairs to receive a corresponding two-pronged stab for each phase of electrical power. Rows of such slots 26 may be provided to allow device supports to be mounted at various levels within a section 14.

Figure 4:
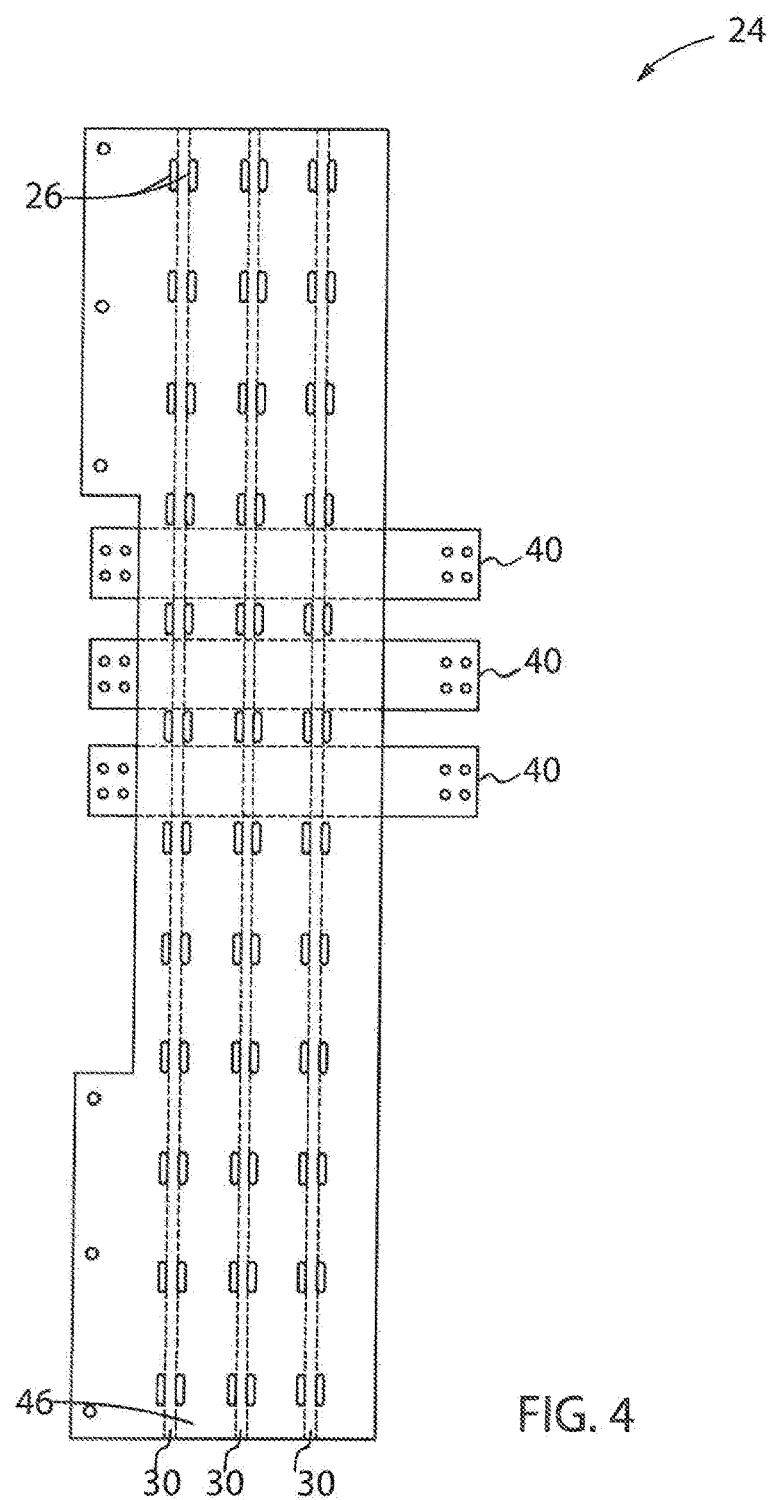
FIG. 4 is an exemplar configuration of the bus system of FIGS. 1-3.

Referring now to FIG. 4, an exemplary configuration of the bus system 24 of FIGS. 1-3 is provided. The bus system 24 may include multiple power busses disposed within a section 14. In the illustrated embodiment, the bus system 24 includes first, second and third vertical bus conductors 30 disposed proximal to one another, which may correspond to differing phases of a three-phase power system (power conductors). Further, the bus system 24 includes first, second and third horizontal bus conductors 40 disposed proximal to one another, which may also correspond to the differing phases of the three-phase power system (power conductors), but in a different direction. It should be appreciated that although a "3 pole" configuration is described, the invention can include a greater or lesser number of poles a "4 pole" configuration, which could be useful, for example, for including a "neutral," or a "single pole" configuration, which could be useful, for example, for providing a single electrical power bus. Such variations are deemed within the scope of the invention.

In certain embodiments, the horizontal bus conductors 40 could be coupled to cabling that supplies three-phase power from an external power supply, such as a power supply grid, and the first, second and third horizontal bus conductors 40 could be coupled to the first, second and third vertical bus conductors 30. Also, in certain embodiments, the horizontal bus conductors 40 of one section could be coupled (or "spliced") with the horizontal bus conductors 40 of another (flanking) section. In alternative embodiments, more horizontal and/or vertical bus conductors could be provided, such as for providing a neutral conductor, a protective earth, ground or additional power phase, or fewer horizontal and/or vertical bus conductors could be provided, as appropriate for the environment.

The bus system 24 may include a bus cover 46 and a rear bus support, that will be described in greater detail below. In the illustrated embodiment, the bus cover 46 may include a molded sheet of synthetic material disposed over the vertical and horizontal bus conductors and may serve to prevent contact with underlying power busses except through the slots 26. The vertical bus conductors 30 are typically made of a bar stock or tubing stock with a flat area that permits them to be mechanically and electrically coupled to corresponding horizontal bus conductors 40 in the bus system 24.

Connection of component supports (such as mounted on plates or drawers, not shown) may be made by two pronged stabs that are received through the slots 26 and engage the individual bus bars behind the bus cover 46. As described above, the bus system 24 further includes a bus support configured to support the vertical and horizontal bus conductors that is described in detail below with reference to FIG. 5.

Figure 5:
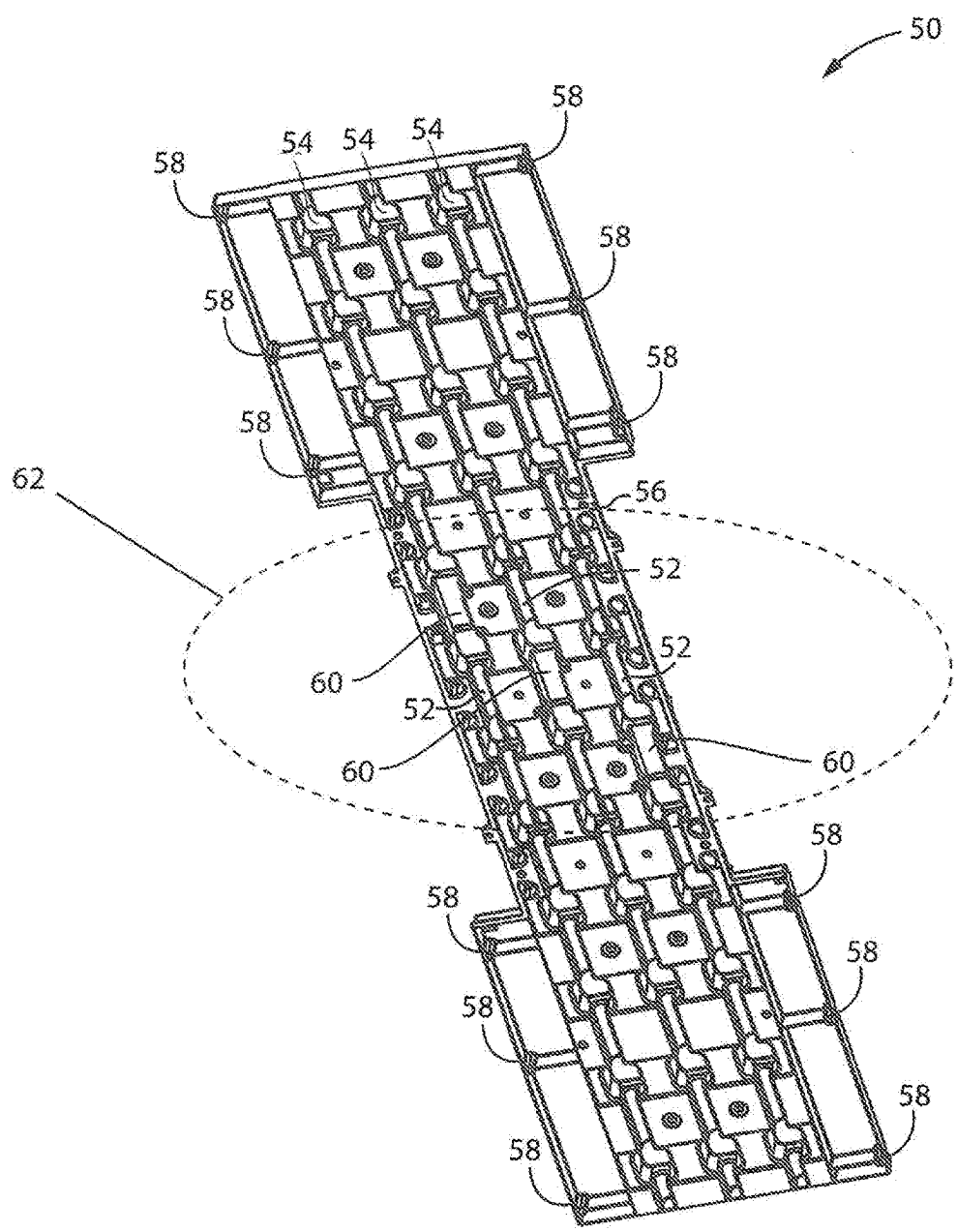
FIG. 5 is an exemplar electrically insulating preconfigured isolated bus support for supporting the power busses of the bus system of FIGS. 1-3.

Referring now to FIG. 5, an exemplary preconfigured electrically insulating isolated bus support 50 (rear view) is illustrated for supporting the power busses of the bus system 24 of FIG. 2. As illustrated, the bus support 50 may be a molding with vertical channels 52 to receive the vertical bus conductors 30 of FIG. 2. Each of the vertical channels 52 may include rear protrusions 54 on a rear side 56 of the bus support 50. In the illustrated embodiment, the bus support 50 mechanically supports the various horizontal and vertical bus conductors. Within the bus system 24, and generally between the bus support 50 and the bus cover 46 (see FIG. 4), each vertical bus conductor may generally include a connection portion that is engaged by stabs of component supports and a bus anchoring portion.

Accordingly, the horizontal bus conductors 40 (see FIG. 4) may be generally supported on a rear surface of the bus support 50, while the vertical bus conductors 40 (see FIG. 4) may be supported on a front surface thereof. In the illustrated embodiment, the bus support 50 includes a series of apertures, openings or holes 58 for receiving mounting bolts or screws. These holes 58 will generally be aligned with corresponding apertures in rear of the electrical system 10 to support the bus system 24 when mounted therein. The vertical bus conductors 30 may be received within corresponding recesses of the vertical channels 52. The recesses may generally be semicircular grooves in which the vertical bus conductors 30 may lie.

Opposing the rear protrusions 54, which may be somewhat deeper than the recesses, are pockets designed to receive and accommodate stabs (not shown) of component supports that will protrude through the slots 26 in the bus cover 46. Furthermore, the bus support 50 includes a series of apertures 60 or openings that extend completely through the bus support 50 for mechanical and electrical connection between the vertical bus conductors 40 and the horizontal bus conductors 40 in a power bus connection area 62 as will be described in greater detail below.

In the illustrated embodiment, the bus support 50 may be formed as a single piece of molded plastic material or other insulator. The material is preferably one that will not degrade or melt with elevated temperatures that may occur during normal operation. In certain embodiments, the bus support 50 may comprise glass filled polyester, a thermoset plastic. The bus support 50 could also include add-on bus support braces (not shown) disposed on the rear side of the bus support which may be configured to contact the channels to limit movement of the vertical bus conductors during a high current event.

Figure 6:
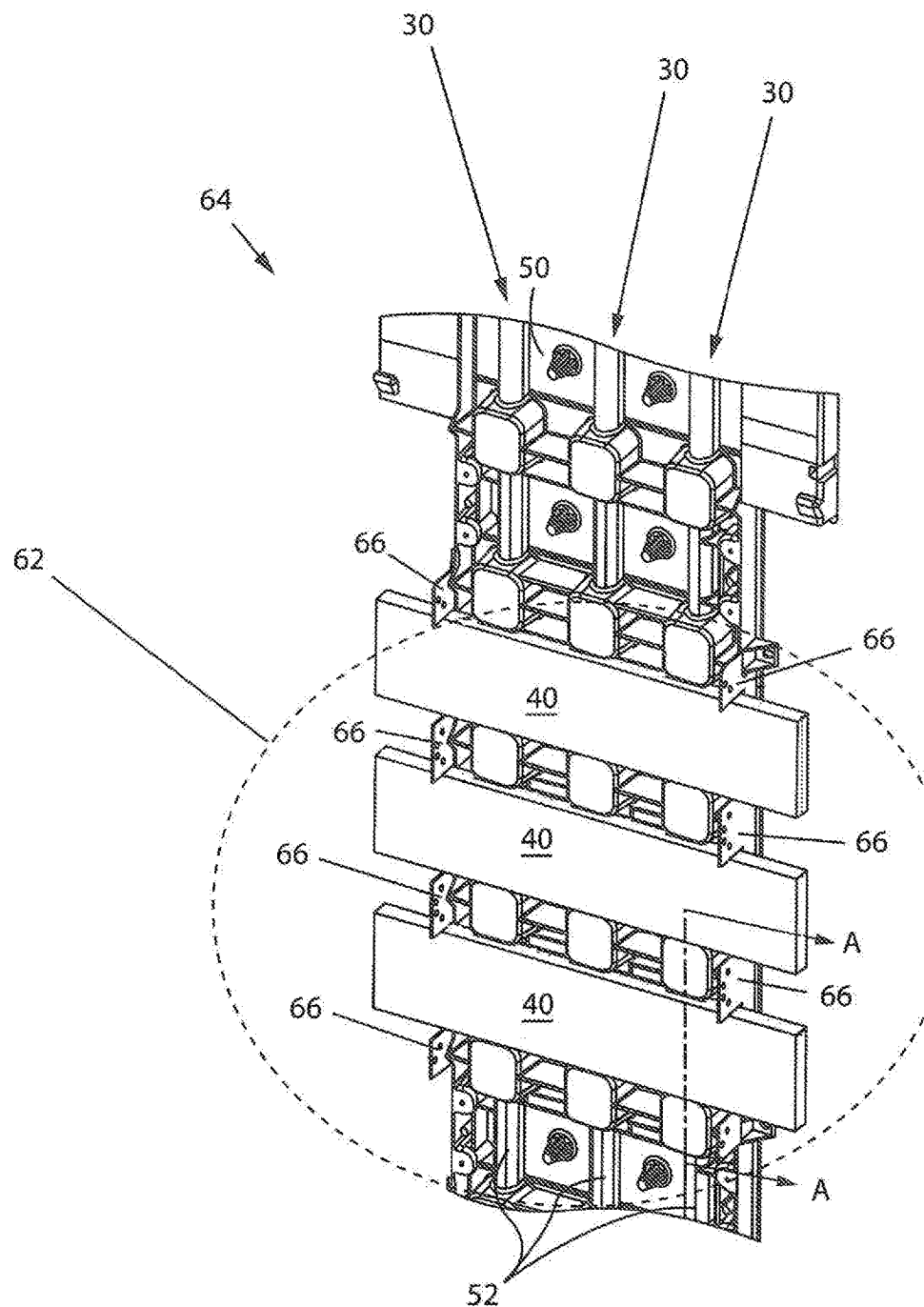
FIG. 6 is a partial view of the bus support of FIG. 5 in which vertical and horizontal bus conductors are disposed thereon.
Figure 7:
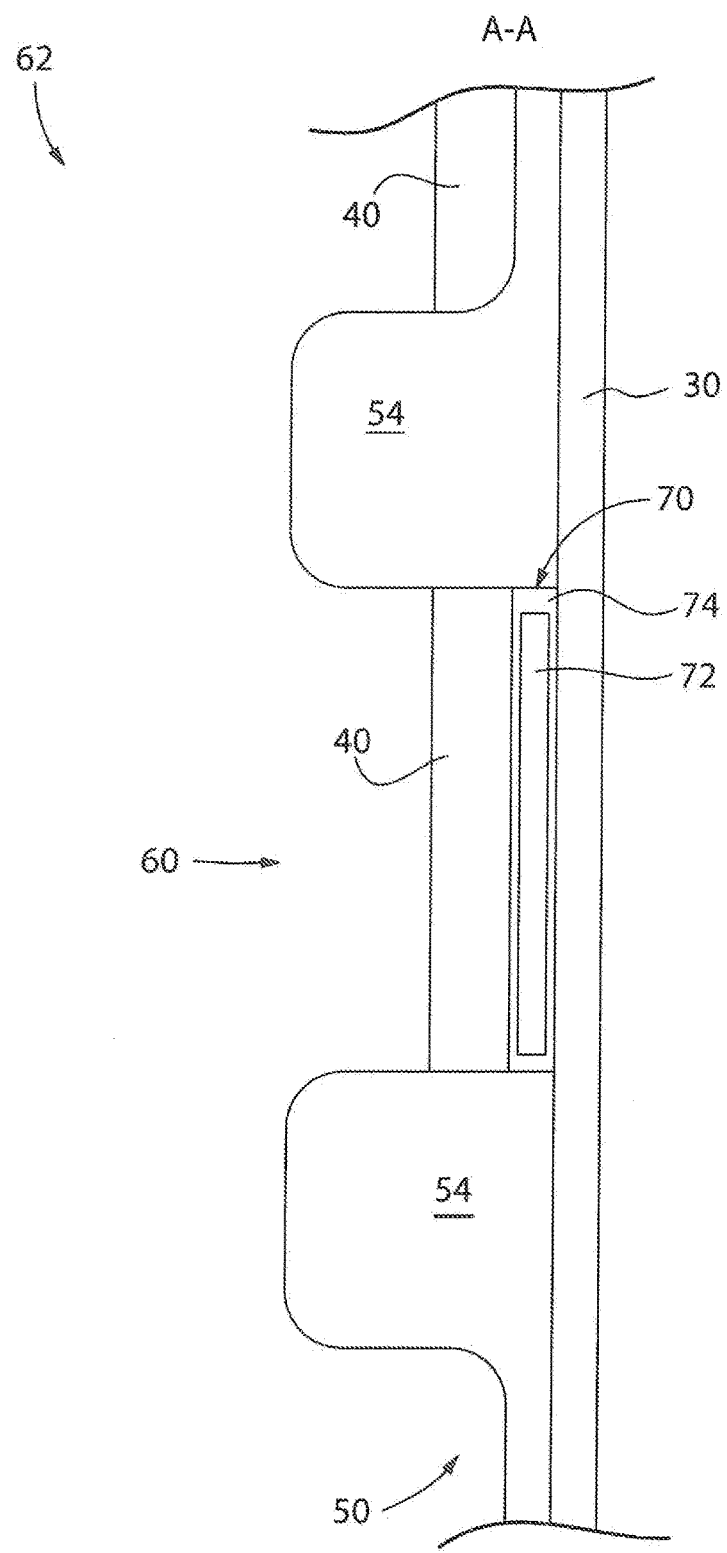
FIG. 7 is a cross-sectional view of a vertical bus conductor electrically connected to a horizontal bus conductor, through an aperture, opening or hole of the bus support of FIG. 6, by a fusible conductive material, in accordance with an aspect of the invention.

Referring now to FIGS. 6 and 7, a partial (rear view) of the bus support 50 (FIG. 6), assembled with vertical bus conductors 30, horizontal bus conductors 40, and fusible conductive materials 70 (FIG. 7), to form a power bus connection system 64, is provided in accordance with an aspect of the invention. The power bus connection system 64 can be provided, for example, in a flanking section 14 in the electrical system 10. The first, second and third vertical bus conductors 30, which can provide power to the units 12, can be placed individually in the vertical channels 52 on a front side of the bus support 50. Also, the first, second and third horizontal bus conductors 40, for providing power to the first, second and third vertical bus conductors 30, respectively, can be placed on a rear side of the bus support 50. The first, second and third vertical bus conductors 30 can be electrically connected to the first, second and third horizontal bus conductors 40 through first, second and third apertures 60 (FIG. 5) via first, second and third fusible conductive materials 70 (FIG. 7), respectively.

Also, in the configuration shown in FIG. 6, a vertical insulating barrier 66 can be provided on edges of the bus support, the vertical insulating barrier 66 being contoured around the horizontal bus conductors 40 to provide electrical isolation and protection in gaps between the horizontal bus conductors 40. A flexi-bar (not shown) or insulated cables can be fastened to each horizontal bus conductor 40 to provide a respective electrical power phase to the horizontal bus conductor 40 from the external power supply received by the electrical system 10. In addition, although one aspect of the invention can provide horizontal bus conductors 40 that substantially rectangular and vertical bus conductors 30 that substantially cylindrical as shown, it should be appreciated that various other geometries for the bus conductors can be realized within the scope of the invention.

Also, while opposing conductors, such as the horizontal bus conductors 40 and the vertical bus conductors 30, can be electrically connected through bus support 50 for a given section 14, it should be appreciated that neighboring sections 14 can also electrically connect conductors without having to connect through a bus support 50. For example, in technique known as "splicing," the horizontal bus conductors 40 of a first section 14 can electrically connect to horizontal bus conductors 40 of a second section 14 that is a neighboring or flanking section, also via fusible conductive materials. In this arrangement, the horizontal bus conductors 40 of the neighboring sections 14 can electrically connect without connecting through a bus support 50. In one aspect, at least 4 layers of conductors, arranged one after another, with fusible conductive materials 70 disposed in between each layer, can be spliced together. Such variations are deemed within the scope of the invention.

Referring now to FIG. 7, a cross-sectional view taken along the line A-A of FIG. 6, illustrates an exemplar vertical bus conductor 30, such as the third vertical bus conductor 30, electrically connected to an exemplar horizontal bus conductor 40, such as the third horizontal bus conductor 40, via a fusible conductive material 70 disposed there between, in accordance with an aspect of the invention. The fusible conductive material 70 can be a manufactured nanotechnology material configured to provide a localized heat source for electrically joining two conductors together. The fusible conductive material 70 can have a thickness of less than 100 µm, and preferably have a thickness of about 40 µm, 60 µm or 80 µm, and can range in size from about 4"×5" and up. The fusible conductive material 70 can also be cut to a desired shape and/or size, such as to conform to the aperture 60, and can be pre-fabricated accordingly. The fusible conductive material 70 could be, for example, "nanofiber" as available from Indium Corp. of Clinton, N.Y., and as described in U.S. Pat. No. 7,635,076, entitled "Method for Fabricating Large Dimension Bonds Using Reactive Multilayer Joining."

In one aspect, the fusible conductive material 70 could comprise a conductive metallic core 72, such as a core comprised of aluminum and/or nickel. The fusible conductive material 70 could also include solder plating 74, which could comprise tin, for electrically joining conductors which may require solder, such as copper bus bars without tin plating. To form the electrical connection, the vertical and horizontal bus conductors 30 and 40, respectively, can be clamped to apply pressure on the fusible conductive material 70. Then, an ignition source, such as a voltage drop produced by terminals of a 9V battery, can be applied to the fusible conductive material 70 to cause an exothermic thermal reaction in which the fusible conductive material 70 elevates substantially in temperature, on the order of about 1500° C., nearly instantaneously, in the localized area through the aperture 60. This can operably melt surfaces of the vertical and horizontal bus conductors 30 and 40, respectively, to produce a fused contiguous electrical connection having good strength and performance with the fusible conductive material 70 in between.

Figure 8:
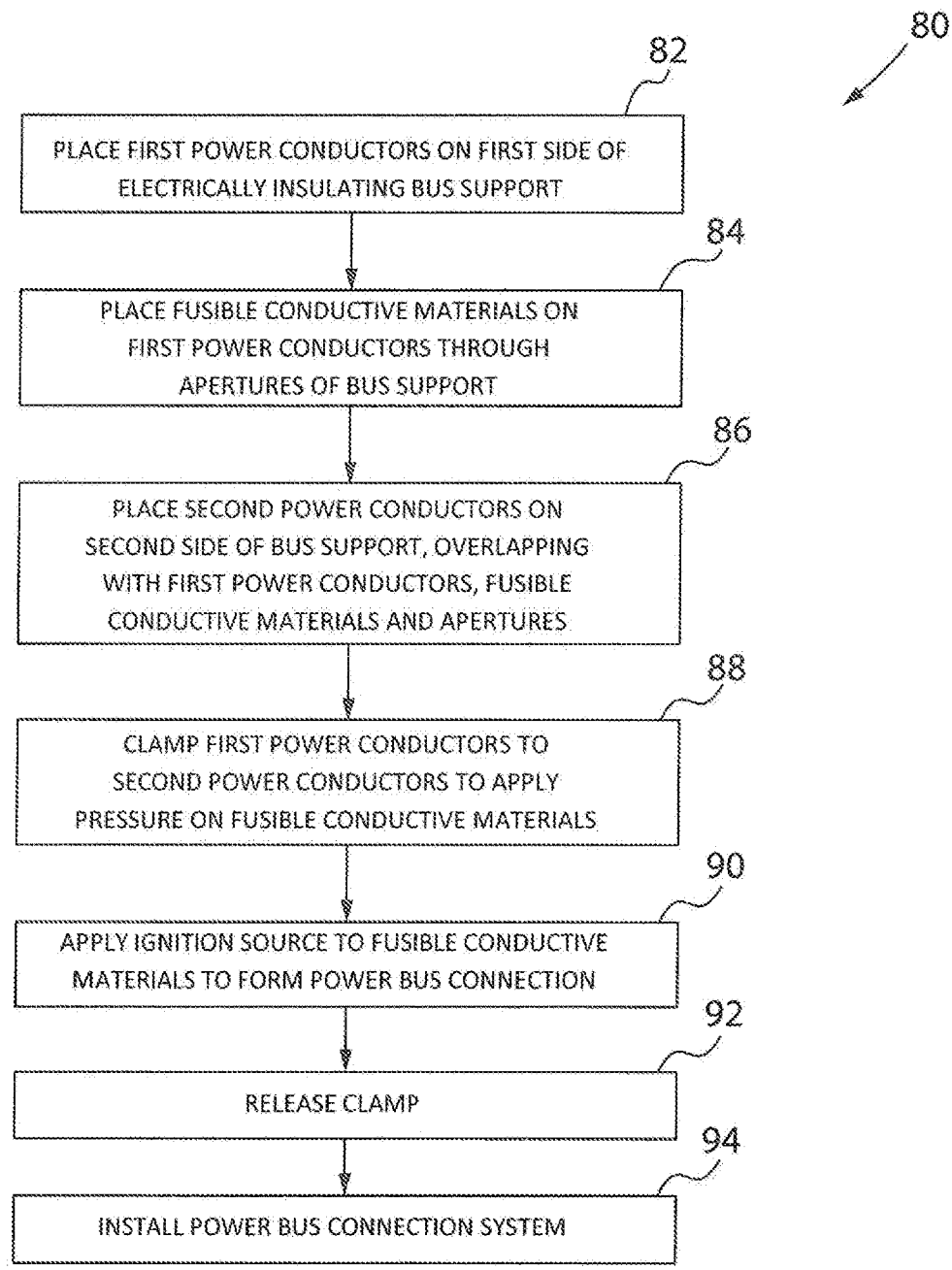
FIG. 8 is a power bus connection method in accordance with an aspect of the invention.

Accordingly, with additional reference to FIG. 8, a process 80 provides a power bus connection method which could be used to assemble the power bus connection system 64 for a section 14. In a first step 82, the first, second and third horizontal bus conductors 40 can be placed on the first side (rear) of the bus support 50. In a second step 84, fusible conductive materials 70 can placed on the first, second and third horizontal bus conductors 40 through the apertures 60. In a third step 86, the first, second and third vertical bus conductors 30 can be placed on the second side (front) of the bus support 50 so that they overlap with the first, second and third horizontal bus conductors 40, the fusible conductive materials 70 and the apertures 60. In a fourth step 88, the first, second and third horizontal bus conductors 40 can be clamped to the first, second and third vertical bus conductors 30 to apply pressure on the fusible conductive materials 70. In a fifth step 90, an ignition source can be applied to the fusible conductive materials 70 to electrically connect the first, second and third horizontal bus conductors 40 to the first, second and third vertical bus conductors 30, respectively, and form the power bus connection system 64. In a sixth step 92, the clamp can be released, and in a seventh step 94, the power bus connection system 64 can be installed in the section 14.

Certain terminology is used herein for purposes of reference only, and thus is not intended to be limiting. For example, terms such as "upper," "lower," "above," and "below" refer to directions in the drawings to which reference is made. Terms such as "front," "back," "rear," "bottom," "side," "left" and "right" describe the orientation of portions of the component within a consistent but arbitrary frame of reference which is made clear by reference to the text and the associated drawings describing the component under discussion. Such terminology may include the words specifically mentioned above, derivatives thereof and words of similar import. Similarly, the terms "first," "second" and other such numerical terms referring to structures do not imply a sequence or order unless clearly indicated by the context.

When introducing elements or features of the present disclosure and the exemplary embodiments, the articles "a," "an," "the" and "said" are intended to mean that there are one or more of such elements or features. The terms "comprising," "including" and "having" are intended to be inclusive and mean that there may be additional elements or features other than those specifically noted. It is further to be understood that the method steps, processes, and operations described herein are not to be construed as necessarily requiring their performance in the particular order discussed or illustrated, unless specifically identified as an order of performance. It is also to be understood that additional or alternative steps may be employed.

It is specifically intended that the present invention not be limited to the embodiments and illustrations contained herein and the claims should be understood to include modified forms of those embodiments including portions of the embodiments and combinations of elements of different embodiments as corning within the scope of the following claims. All of the publications described herein including patents and non-patent publications are hereby incorporated herein by reference in their entireties.

What is claimed is:

1. A power bus connection system comprising:
   an electrically insulating bus support having an aperture;
   a first power conductor disposed on a first side of the bus support, the first power conductor for providing an electrical power phase to an electrical unit; and
   a second power conductor disposed on a second side of the bus support, the second power conductor for providing the electrical power phase to the first power conductor,
   wherein the first and second power conductors are electrically connected through the aperture by a fusible conductive material arranged between the conductors, wherein the fusible conductive material melts surfaces of the conductors together in an exothermic thermal reaction to electrically join the first power conductor to the second power conductor through the aperture upon application of an ignition source producing a voltage drop.

2. The system of claim 1, wherein the aperture is a first aperture, the first power conductor is a first vertical bus conductor, the second power conductor is a first horizontal bus conductor, and the fusible conductive material is a first fusible conductive material, and further comprising:
   the electrically insulating bus support having second and third apertures;
   second and third vertical bus conductors disposed on the first side of the bus support, the second and third vertical bus conductors for providing second and third electrical power phases, respectively; and second and third horizontal bus conductors disposed on the second side of the bus support, the second and third horizontal bus conductors for providing the second and third electrical power phases to the second and third vertical bus conductors, respectively, wherein the second vertical bus conductor and the second horizontal bus conductor are electrically connected through the second aperture by a second fusible conductive material configured to electrically join the second vertical bus conductor to the second horizontal bus conductor upon application of an ignition source producing a voltage drop, and the third vertical bus conductor and the third horizontal bus conductor are electrically connected through the third aperture by a third fusible conductive material configured to electrically join the third vertical bus conductor to the third horizontal bus conductor upon application of an ignition source producing a voltage drop.

3. A system of claim 2, wherein the bus support includes first, second and third vertical channels configured to receive the first, second and third vertical bus conductors, respectively.

4. The system of claim 1, wherein the fusible conductive material has a thickness of less than 100 μm.

5. The system of claim 1, wherein the ignition source is a battery configured to produce the voltage drop.

6. The system of claim 1, wherein the fusible conductive material is comprised of aluminum and nickel.

7. The system of claim 6, wherein the fusible conductive material further comprises solder plating.

8. The system of claim 1, wherein the first power conductor is cylindrical in shape.

9. The system of claim 8, wherein the second power conductor is rectangular in shape.

10. A power bus connection method comprising:
placing a first power conductor on a first side of an electrically insulating bus support having an aperture, the first power conductor for providing an electrical power phase;
placing a second power conductor on a second side of the bus support, the second power conductor for providing the electrical power phase to the first power conductor; and
electrically connecting the first and second power conductors through the aperture using a fusible conductive material arranged between the conductors, wherein the fusible conductive material melts surfaces of the conductors together in an exothermic thermal reaction to electrically join the first power conductor to the second power conductor though the aperture upon applying of an ignition source producing a voltage drop.

11. The method of claim 10, wherein the ignition source is a battery producing a voltage drop.

12. The method of claim 10, further comprising clamping the first power conductor to the second power conductor to apply pressure on the fusible conductive material before applying the ignition source.

13. A Motor Control Center (MCC) comprising:
a section forming a shell around a device mounting volume for supporting a plurality of electrical units, the section including:
first, second and third vertical copper bus conductors extending in a vertical direction for providing power to the electrical units, the first, second and third vertical bus conductors providing first, second and third electrical power phases, respectively, to the plurality of electrical units;
first, second and third horizontal copper bus conductors extending in a horizontal direction across the vertical direction for providing the first, second and third electrical power phases to the first, second and third vertical bus conductors, respectively; and
an electrically insulating bus support having first, second and third apertures, the electrically insulating bus support being disposed along a rear wall of the section,
wherein the first, second and third vertical bus conductors are disposed on a first side of the bus support, and the first, second and third horizontal bus conductors are disposed on a second side of the bus support, and
wherein the first, second and third vertical bus conductors are electrically connected to the first, second and third horizontal bus conductors at intersections through the first, second and third apertures via first, second and third fusible conductive materials arranged between conductors at the first, second and third apertures, respectively, wherein each fusible conductive material melts surfaces of conductors together in an exothermic thermal reaction to electrically join a vertical bus conductor to a horizontal bus conductor through an aperture upon application of an ignition source producing a voltage drop.

14. A MCC of claim 13, wherein the bus support further comprises first, second and third vertical channels configured to receive the first, second and third vertical bus conductors, respectively.

15. A MCC of claim 13, wherein the first, second and third vertical bus conductors are configured to provide three-phase power to the electrical units.

16. The MCC of claim 13, wherein the fusible conductive materials have thicknesses of less than 100 μm.

17. The MCC of claim 13, wherein the ignition source is a battery configured to produce a voltage drop.

18. The MCC of claim 13, wherein the fusible conductive materials comprise aluminum and nickel.

19. The MCC of claim 13, wherein the fusible conductive materials further comprise solder plating.

* * * * *

UNITED STATES PATENT AND TRADEMARK OFFICE
CERTIFICATE OF CORRECTION

PATENT NO. : 10,158,203 B2
APPLICATION NO. : 15/476192
DATED : December 18, 2018
INVENTOR(S) : Corey A. Peterson Page 1 of 1

It is certified that error appears in the above-identified patent and that said Letters Patent is hereby corrected as shown below:

In the Claims

Claim 10, Column 9, Line 51, delete "though" and substitute therefor -- through --.

Signed and Sealed this
Nineteenth Day of February, 2019

Andrei Iancu
*Director of the United States Patent and Trademark Office*